United States Patent
Cai et al.

(10) Patent No.: US 9,564,358 B1
(45) Date of Patent: Feb. 7, 2017

(54) FORMING RELIABLE CONTACTS ON TIGHT SEMICONDUCTOR PITCH

(71) Applicants: INTERNATIONAL BUSINESS MACHINES CORPORATION, Armonk, NY (US); GLOBALFOUNDRIES INC., Cayman Islands (KY)

(72) Inventors: Xiuyu Cai, Niskayuna, NY (US); Kangguo Cheng, Schenectady, NY (US); Ali Khakifirooz, Los Altos, CA (US); Ruilong Xie, Niskayuna, NY (US); Tenko Yamashita, Schenectady, NY (US)

(73) Assignees: INTERNATIONAL BUSINESS MACHINES CORPORATION, Armonk, NY (US); GLOBALFOUNDRIES INC, Cayman Islands (KY)

( * ) Notice: Subject to any disclaimer, the term of this patent is extended or adjusted under 35 U.S.C. 154(b) by 21 days.

(21) Appl. No.: 14/849,269

(22) Filed: Sep. 9, 2015

(51) Int. Cl.
| | |
|---|---|
| H01L 21/768 | (2006.01) |
| H01L 29/78 | (2006.01) |
| H01L 29/66 | (2006.01) |
| H01L 29/08 | (2006.01) |

(52) U.S. Cl.
CPC ... *H01L 21/76831* (2013.01); *H01L 21/76805* (2013.01); *H01L 21/76895* (2013.01); *H01L 29/0847* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 7,405,116 B2 | 7/2008 | Carter et al. | |
| 8,362,568 B2 | 1/2013 | Lin et al. | |
| 8,377,759 B2 | 2/2013 | Cheng et al. | |
| 8,765,599 B2 | 7/2014 | Yuan et al. | |
| 8,809,184 B2 | 8/2014 | Yuan et al. | |
| 8,890,260 B2 | 11/2014 | Chuang et al. | |
| 8,921,191 B2 | 12/2014 | Cai et al. | |

(Continued)

OTHER PUBLICATIONS

Basker, V.S. et al.,, "A 0.063 μm2 FinFET SRAM cell demonstration with conventional lithography using a novel integration scheme with aggressively scaled fin and gate pitch," 2010 Symposium on VLSI Technology, Jun. 2010. (pp. 19-20).

(Continued)

*Primary Examiner* — Asok K Sarkar
(74) *Attorney, Agent, or Firm* — Tutunjian & Bitetto; Vazken Alexanian

(57) ABSTRACT

A method of forming a semiconductor device includes forming a trench in a passivating layer between neighboring fins. A barrier is formed in the trench. Conductive contacts are formed in the passivating layer to provide electrical connectivity to the fins. The conductive contacts are in direct contact with sidewalls of the barrier. A semiconductor device includes a passivating layer over a pair of fins. A barrier extends through the passivating layer and between the pair of fins and that electrically isolates the fins. Electrical contacts are formed through the passivating layer to the fins. The electrical contacts directly contact sidewalls of the barrier.

15 Claims, 5 Drawing Sheets

(56) References Cited

U.S. PATENT DOCUMENTS

| | | | |
|---|---|---|---|
| 8,946,793 B2 | 2/2015 | Xie et al. | |
| 8,975,712 B2 | 3/2015 | Rashed et al. | |
| 8,981,493 B2 | 3/2015 | Cheng et al. | |
| 2011/0127589 A1 | 6/2011 | Chen et al. | |
| 2012/0001263 A1 | 1/2012 | Richter et al. | |
| 2012/0256238 A1* | 10/2012 | Ning | H01L 21/84 257/280 |
| 2014/0167162 A1 | 6/2014 | He et al. | |
| 2015/0060960 A1 | 3/2015 | Xie et al. | |
| 2015/0061015 A1 | 3/2015 | He et al. | |
| 2015/0069527 A1 | 3/2015 | Kerber et al. | |
| 2015/0069531 A1 | 3/2015 | Naczas et al. | |
| 2015/0069532 A1 | 3/2015 | Xie et al. | |
| 2015/0279975 A1* | 10/2015 | Hsiao | H01L 29/66818 257/401 |
| 2015/0303295 A1* | 10/2015 | Wan | H01L 29/785 257/401 |
| 2016/0049394 A1* | 2/2016 | Shin | H01L 27/0886 257/401 |
| 2016/0049516 A1* | 2/2016 | Huang | H01L 29/7853 257/401 |
| 2016/0254370 A1* | 9/2016 | Kelly | H01L 29/0847 |

OTHER PUBLICATIONS

Guillorn, M. et al., "FinFET Performance Advantage at 22nm: An AC perspective," 2008 Symposium on VLSI Technology, Jun. 2008. (pp. 12-13).

\* cited by examiner

US 9,564,358 B1

FORMING RELIABLE CONTACTS ON TIGHT SEMICONDUCTOR PITCH

BACKGROUND

Technical Field

The present invention relates to forming semiconductor devices with small device pitch and, more particularly, to forming a liner between contacts.

Description of the Related Art

As the size of transistors and other semiconductor devices decreases, these devices may be packed with ever greater efficiency onto integrated chips. In addition, improved fabrication technologies allow these devices to be formed closer together than ever before.

However, as the pitch between semiconductor devices decreases and the individual components of the devices come closer together, the risk of fabrication errors increases. In addition, the fabrication of some components may be coarse relative to others. In one example, forming contacts to the gates and source and drain regions of transistors can be difficult on tight semiconductor pitches, as a larger top critical dimension is used. This may result in contacts that are large enough to contact neighboring devices, creating short circuits that may lead to device failure.

The ground rules of the integrated chip design therefore need the contacts to be separated to prevent tip-to-tip or tip-to-side shorts, limiting the reduction in the area consumed by the device that would otherwise be possible with improved fabrication technologies.

SUMMARY

A method for forming semiconductor devices includes forming a trench in a passivating layer between neighboring fins. A barrier is formed in the trench. Conductive contacts are formed in the passivating layer to provide electrical connectivity to the fins. The conductive contacts are in direct contact with sidewalls of the barrier.

A method for forming semiconductor devices includes forming a raised source and drain layer directly on a plurality of neighboring fins. A passivating layer is formed directly over the raised source and drain layer. A trench is formed that extends through the passivating layer and the raised source and drain layer between neighboring fins. A barrier is formed in the trench. Conductive contacts are formed in the passivating layer to provide electrical connectivity to the fins, wherein the conductive contacts are in direct contact with sidewalls of the barrier.

A semiconductor device includes a passivating layer over a pair of fins. A barrier extends through the passivating layer and between the pair of fins and that electrically isolates the fins. Electrical contacts are formed through the passivating layer to the fins. The electrical contacts directly contact sidewalls of the barrier.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention prevent short circuits between adjacent device contacts by providing a robust liner between devices. The liner may be formed with the width of a single fin pitch shallow-trench isolation (STI) to provide isolation between the neighboring devices.

Figure 1:
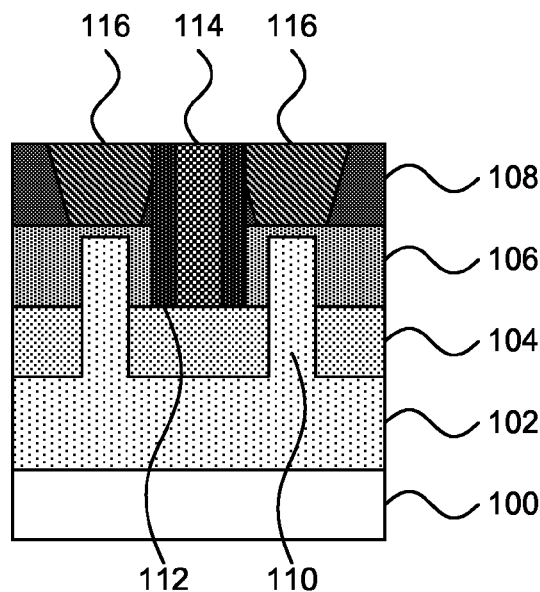
FIG. 1 is a cross-sectional view of a semiconductor device including a barrier layer between neighboring fin contacts in accordance with one embodiment of the present principles.

Referring now to the drawings in which like numerals represent the same or similar elements and initially to FIG. 1, a cross section of two transistor devices is shown with a liner 114 between the contacts 116. A semiconductor layer 102 is formed with fins 110 on a bulk semiconductor substrate 100. The semiconductor layer 102 may be formed using silicon or any other appropriate semiconductor material and may be a bulk semiconductor substrate or a semiconductor-on-insulator substrate. A dielectric material 104 is filled into the trenches between the fins 110, where the dielectric material 104 may be any suitable insulating material such as, e.g., silicon oxide. A layer of raised source/drain material 106 is formed over the dielectric 104 and around the fins 110. It should be understood that the raised source/drain regions 106 are electrically connected to the source and drain regions of their respective fins 110. The raised source and drain regions 106 may be formed by epitaxial growth from the fins and may include a doped semiconductor and/or silicide-type metal infiltration to enhance conductivity.

A passivating layer 108 is formed over the raised source and drain regions 108. The passivating layer 108 may be formed from any appropriate insulating material, including for example silicon dioxide. Two contacts 116 are shown, one for each of the respective fins 110. The contacts are separated by a barrier formed from a liner 112 and a flowable insulator 114. The flowable insulator 114 may be formed as, e.g., a chemical vapor deposition of silicon dioxide. The liner 112 may be formed from, e.g., a dielectric such as hafnium dioxide or silicon nitride. The barrier prevents the contacts 116 from coming into contact with one another as a result of process variations, such that the contacts 116 may be placed closer together. This in turn means that the fins 110 can be placed closer together, such that the overall pitch between devices is decreased.

Illustrative examples of silicon-containing materials suitable for the bulk-semiconductor substrate 100 include, but are not limited to, silicon, silicon germanium, silicon germanium carbide, silicon carbide, polysilicon (i.e., polySi), epitaxial silicon (i.e., epi-Si), amorphous silicon (i.e., α:Si), and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. Although not depicted in FIG. 1, the semiconductor substrate 100 may also be a semiconductor on insulator (SOI) substrate.

The semiconductor layer 102 and fins 110 may be formed from any appropriate semiconductor material including, e.g., type IV and type III-V semiconductors. The term "type III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
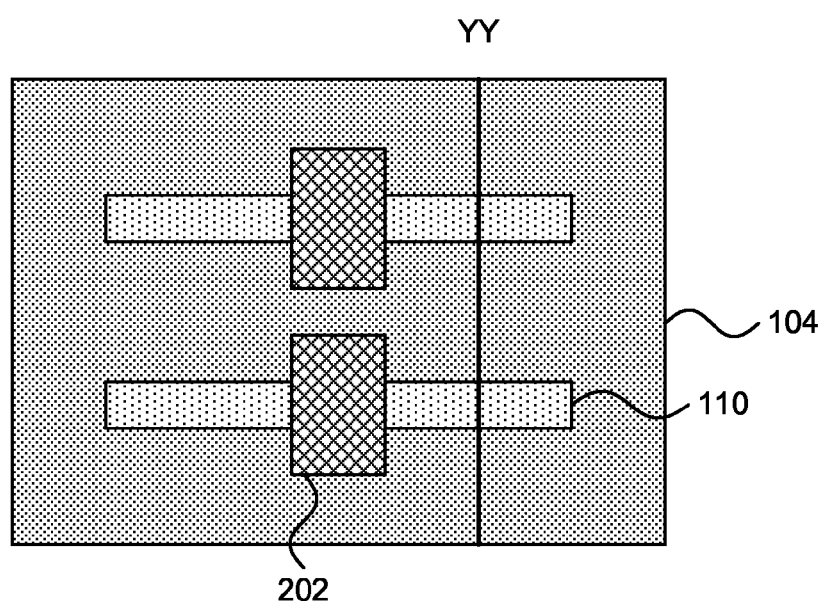
FIG. 2 is a top-down view of a step in fabricating a semiconductor device including a barrier layer between neighboring fin contacts in accordance with one embodiment of the present principles.

Referring now to FIG. 2, a top-down view of a step in the formation of semiconductor devices is shown. The fins 110 are shown emerging from the dielectric layer 104. Gates 202 are formed over the fins 110 and may be formed from any appropriate material including, for example, polymorphous silicon or a metal. The gates 202 may be formed by any appropriate process, including conventional lithography techniques.

Shown on FIG. 2 is the line YY, representing a cross section of the structure. This same cross section is used herein to illustrate subsequent steps of the fabrication process. As such, it should be understood that the process is shown herein at a point on the fins 110 that is apart from the gates 202.

Figure 3:
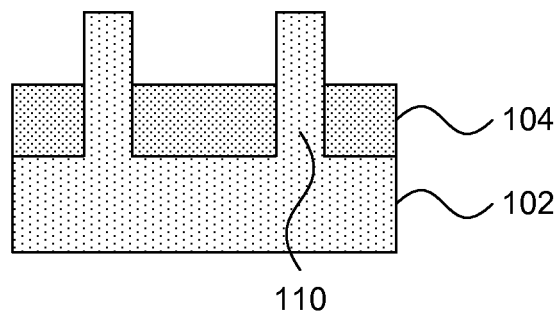
FIG. 3 is a cross-sectional view of a step in fabricating a semiconductor device including a barrier layer between neighboring fin contacts in accordance with one embodiment of the present principles.

Referring now to FIG. 3, a cross sectional view of a step in the formation of semiconductor devices is shown along the YY cut of FIG. 2. Fins 110 are formed from a layer of semiconductor 102 using, e.g., shallow trench isolation to remove material from the semiconductor layer 102. The trenches may be formed by any appropriate etching process including, e.g., reactive ion etching. It should be noted that the region of the fins 110 shown is in the source/drain region and therefore may be doped according to the type of device being formed. In one example, the fins 110 may be doped with p-type or n-type dopants by any appropriate doping process including, e.g., in situ doping or implantation doping. The dielectric layer 104 is deposited in the trenches between the fins 110 to provide electrical isolation between the fins 110. The dielectric layer may be formed to the desired depth or may be filled in over the fins 110 and subsequently etched down to the desired depth, leaving at least a portion of the fins 110 exposed.

Figure 4:
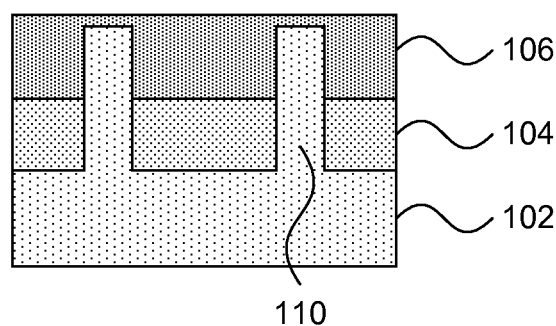
FIG. 4 is a cross-sectional view of a step in fabricating a semiconductor device including a barrier layer between neighboring fin contacts in accordance with one embodiment of the present principles.

Referring now to FIG. 4, a cross sectional view of a step in the formation of semiconductor devices is shown along the YY cut of FIG. 2. A raised source/drain layer 106 is formed. It is particularly contemplated that the raised source/drain layer 106 may be epitaxially grown in contact with the fins 110 and then planarized to a desired height, creating a single crystalline structure that includes the fins 110 and the raised source/drain layer 106. The raised source/drain layer 106 is also doped, with a same doping type as the fins 110, and may be doped in situ during the epitaxial growth or may alternatively be doped through dopant implantation.

Figure 5:
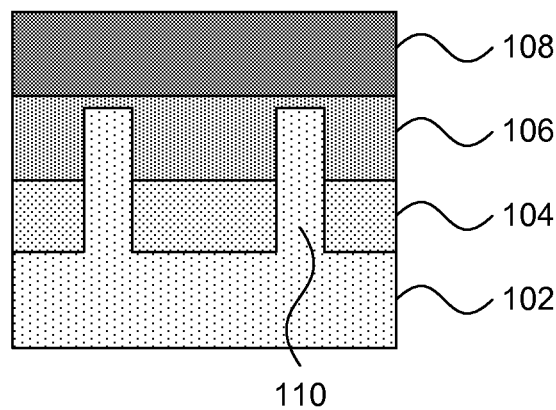
FIG. 5 is a cross-sectional view of a step in fabricating a semiconductor device including a barrier layer between neighboring fin contacts in accordance with one embodiment of the present principles.

Referring now to FIG. 5, a cross sectional view of a step in the formation of semiconductor devices is shown along the YY cut of FIG. 2. A passivating layer 108 is formed over the raised source/drain layer 106. The passivating layer is an insulator, such as silicon dioxide, that is formed using any appropriate method including, e.g., chemical vapor deposition, atomic layer deposition, physical vapor deposition, etc. After formation, the passivating layer may be reduced to any specified height through, e.g., chemical mechanical planarization.

Figure 6:
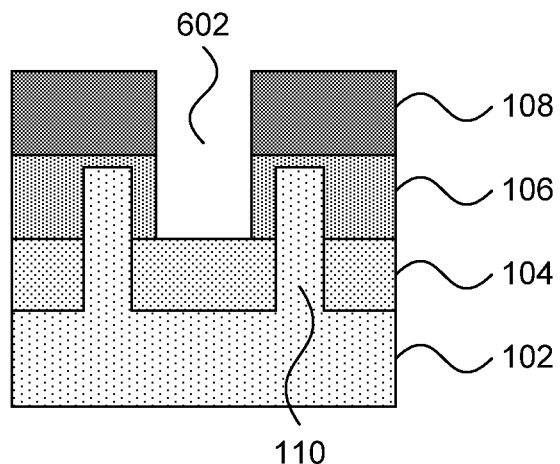
FIG. 6 is a cross-sectional view of a step in fabricating a semiconductor device including a barrier layer between neighboring fin contacts in accordance with one embodiment of the present principles.

Referring now to FIG. 6, a cross sectional view of a step in the formation of semiconductor devices is shown along the YY cut of FIG. 2. A trench 602 is formed in the passivating layer 108 and in the raised source/drain layer 106. The trench 602 extends down to the dielectric layer 104. The trench 602 may be formed by any appropriate anisotropic etch process including, e.g., reactive ion etching. The trench 602 separates the two fins 110 along their entire length, providing electrical separation between the devices that will eventually be formed on the fins 110.

Figure 7:
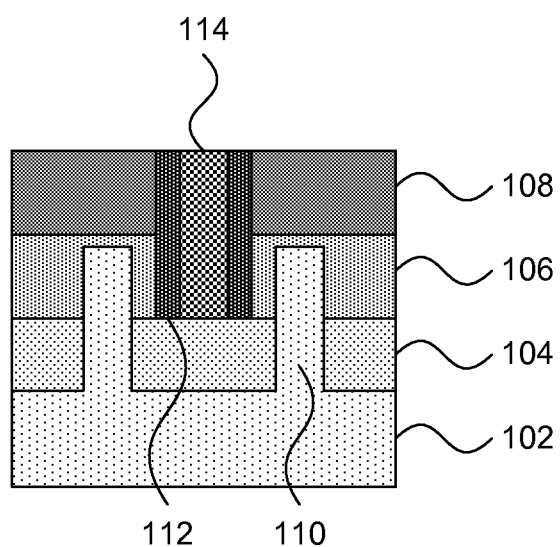
FIG. 7 is a cross-sectional view of a step in fabricating a semiconductor device including a barrier layer between neighboring fin contacts in accordance with one embodiment of the present principles.

Referring now to FIG. 7, a cross sectional view of a step in the formation of semiconductor devices is shown along the YY cut of FIG. 2. The liner 112 is formed from an appropriate dielectric such as, e.g., hafnium dioxide or silicon dioxide. The liner 112 may be formed by depositing a uniform layer in the trench 602 and over the passivating layer 108 and then performing an anisotropic etch, such as reactive ion etching, to remove any liner material remaining on horizontal surfaces. The barrier oxide 114 is then filled into the trench 602.

Figure 8:
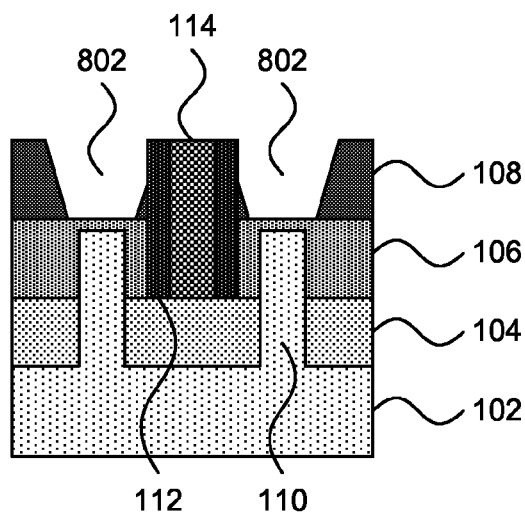
FIG. 8 is a cross-sectional view of a step in fabricating a semiconductor device including a barrier layer between neighboring fin contacts in accordance with one embodiment of the present principles.

Referring now to FIG. 8, a cross sectional view of a step in the formation of semiconductor devices is shown along the YY cut of FIG. 2. Trenches 802 are etched out of the passivating layer 108 using an anisotropic etch. The trenches 802 are shown having sloped walls to illustrate the uncertainty in etching that can result in shorts and other errors. In a conventional device, these uncertainties could result in the contacts of respective fin touching one another. A conductive material is subsequently filled into the trenches 802 to form contacts 116 as shown in FIG. 1. The conductive material may be, for example, a metal or any other material having sufficiently high conductivity. In addition, a silicide or similar metal infiltration can be formed on the surface of the raised source/drain layer 106 to facilitate electrical contact with the contacts 116. Because of the presence of the liner 112/114, imperfections in the trenches 802 will not result in the contacts 116 touching one another.

Figure 9:
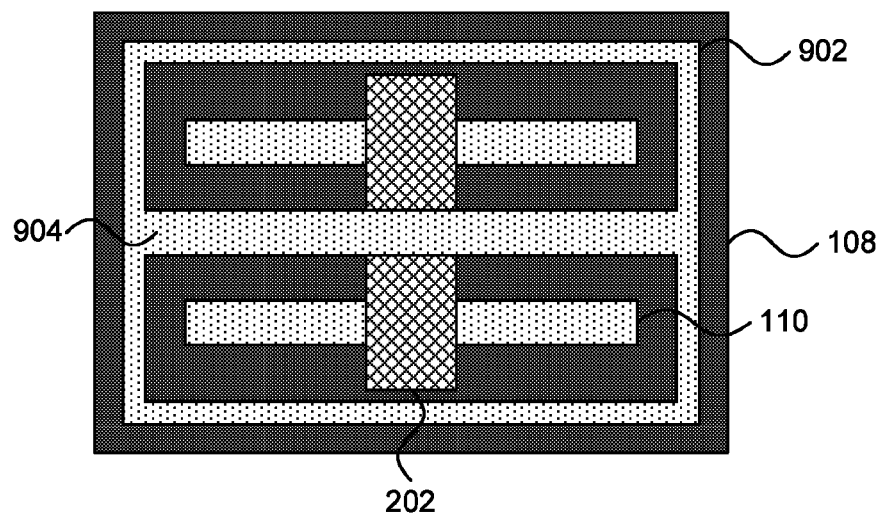
FIG. 9 is a top-down view of a step in fabricating a semiconductor device including a barrier layer between neighboring fin contacts in accordance with one embodiment of the present principles.

Referring now to FIG. 9, a top-down view of a step in the formation of semiconductor devices is shown, corresponding to the step shown above in FIG. 6. The trenches 902 are formed in the passivating layer 108, penetrating through the raised source and drain layer 106, to expose the dielectric layer 104. A trench 602/904 separates the fins 110 and gates 202 of neighboring devices. The liner 112 and barrier dielectric 114 is formed in the trenches 902 and 904 all around the devices. This provides a superior level of isolation for the devices, allowing them to be placed closely together without risking defects.

Figure 10:
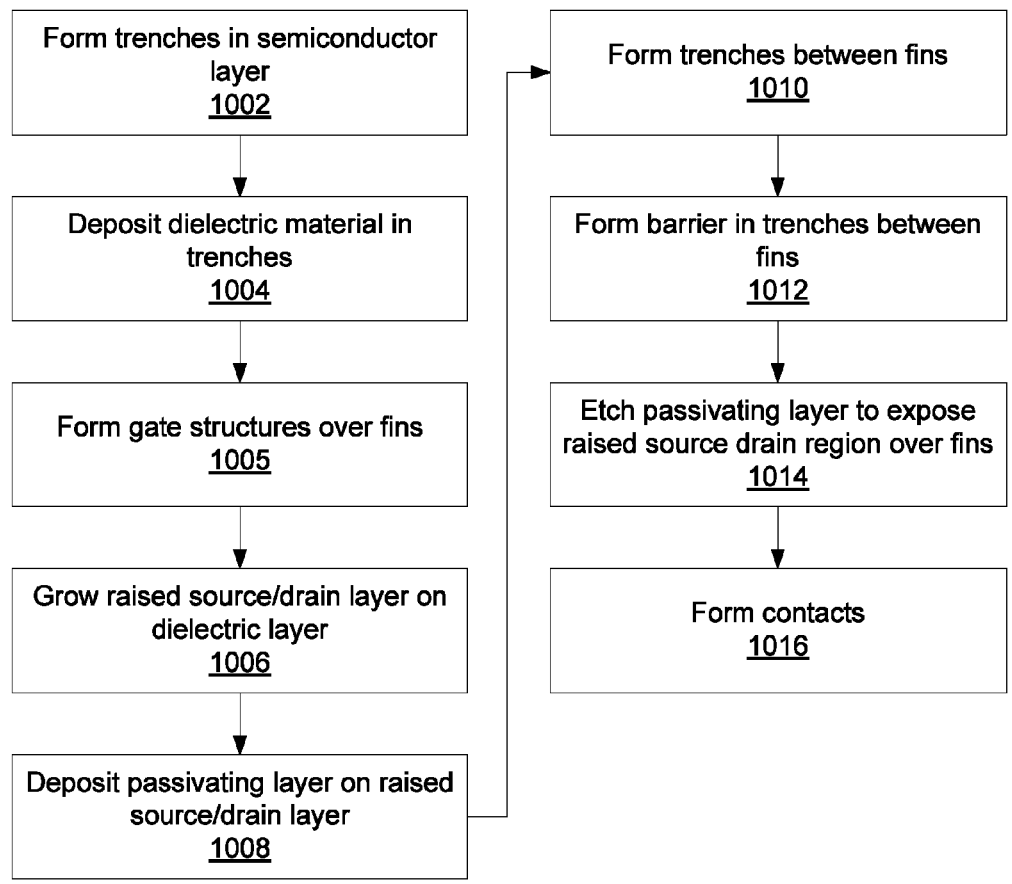
FIG. 10 is a block/flow diagram of a method for fabricating a semiconductor device including a barrier layer between neighboring fin contacts in accordance with one embodiment of the present principles.

Referring now to FIG. 10, a method of forming semiconductor devices is shown. Block 1002 forms trenches in the semiconductor layer 102 to form the fins 110. As noted above, the trenches establish shallow trench isolation and may be formed by any appropriate etching technique. Block 1004 deposits dielectric material 104 in the trenches. Block 1005 forms a gate structure 202 over the fins 110 by any appropriate process and block 1006 grows the raised source and drain layer 106 over the fins 110 and the dielectric material 104 and may include in situ doping or a separate implantation step to add p-type or n-type dopants. Block 1006 grows the raised source and drain layer 106 using, e.g., epitaxial growth.

Block 1008 deposits a passivating layer 108 on the raised source/drain layer 108. The passivating layer 108 may be deposited by any appropriate deposition technique, as described above, and then planarized to a specified thickness. Block 1010 forms trenches 904 between the fins, creating isolation that extends down to the level of the dielectric material 104. Block 1012 forms the barrier in the trenches 904, creating the dielectric liner 112 and the dielectric barrier 114. Block 1014 etches the passivating layer 108 to expose areas of the raised source and drain regions located over the fins 110. Block 1016 forms the contacts 116, optionally forming a silicide-like metal infiltration layer on the raised source and drain regions 106 to facilitate electrical connection between the fins 110 and the contacts 116.

Having described preferred embodiments of semiconductor devices on tight semiconductor pitches and methods of forming the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:
1. A method for forming semiconductor devices, comprising:

forming a trench in a passivating layer between neighboring fins;

forming a barrier in the trench; and forming conductive contacts in the passivating layer to provide electrical connectivity to the fins, wherein the conductive contacts are in direct contact with sidewalls of the barrier.

2. The method of claim 1, further comprising forming a raised source and drain layer directly on the neighboring fins.

3. The method of claim 2, wherein forming the trench further comprises forming the trench in the raised source and drain layer, separating the raised source and drain layer into respective raised source and drain regions for the respective fins.

4. The method of claim 2, further comprising etching the passivating layer in a region over the fins with an etch that does not affect the barrier to form contact trenches, wherein the conductive contacts are formed in the contact trenches.

5. The method of claim 2, wherein forming the raised source and drain layer comprises forming the raised source and drain layer at a height that exceeds a height of the fins.

6. The method of claim 5, wherein the conductive contacts are formed directly on the raised source and drain layer.

7. The method of claim 2, further comprising forming a gate structure on each of the neighboring fins.

8. The method of claim 1, wherein forming the barrier comprises:

depositing a liner dielectric along sidewalls of the trench; and forming filling the remaining trench with a barrier dielectric.

9. The method of claim 8, wherein forming the liner dielectric comprises:

depositing a uniform layer of dielectric material over the all sides of the trench; and anisotropically etching the layer of dielectric material to remove material on horizontal surfaces.

10. A method for forming semiconductor devices, comprising:

forming a raised source and drain layer directly on a plurality of neighboring fins;

forming a passivating layer directly over the raised source and drain layer;

forming a trench that extends through the passivating layer and the raised source and drain layer between neighboring fins;

forming a barrier in the trench; and forming conductive contacts in the passivating layer to provide electrical connectivity to the fins, wherein the conductive contacts are in direct contact with sidewalls of the barrier.

11. The method of claim 10, further comprising etching the passivating layer in a region over the fins with an etch that does not affect the barrier to form contact trenches, wherein the conductive contacts are formed in the contact trenches.

12. The method of claim 10, wherein forming the raised source and drain layer comprises forming the raised source and drain layer at a height that exceeds a height of the fins.

13. The method of claim 12, wherein the conductive contacts are formed directly on the raised source and drain layer.

14. The method of claim 10, wherein forming the barrier comprises:

forming a liner dielectric along sidewalls of the trench; and forming filling the remaining trench with a barrier dielectric.

15. The method of claim 14, wherein forming the liner dielectric comprises:

depositing a uniform layer of dielectric material over the all sides of the trench; and anisotropically etching the layer of dielectric material to remove material on horizontal surfaces.

* * * * *